United States Patent [19]

Sone et al.

[11] Patent Number: 5,650,645
[45] Date of Patent: Jul. 22, 1997

[54] FIELD EFFECT TRANSISTOR HAVING CAPACITOR BETWEEN SOURCE AND DRAIN ELECTRODES

[75] Inventors: Tsutomu Sone; Toshinori Nishii; Keizo Hagimoto, all of Tokyo; Yasuhiro Koseki, Yamagata, all of Japan

[73] Assignee: NEC Corporation, Tokyo, Japan

[21] Appl. No.: 608,945

[22] Filed: Feb. 29, 1996

Related U.S. Application Data

[63] Continuation of Ser. No. 395,073, Feb. 27, 1995, abandoned.

[30] Foreign Application Priority Data

Feb. 28, 1994 [JP] Japan .................... 6-030672

[51] Int. Cl.⁶ .................................................. H01L 29/76
[52] U.S. Cl. ...................... 257/288; 257/277; 257/532
[58] Field of Search ............................ 257/379, 532, 257/272, 277, 288

[56] References Cited

U.S. PATENT DOCUMENTS

| | | | |
|---|---|---|---|
| 3,492,511 | 1/1970 | Crawford | 307/304 |
| 4,974,039 | 11/1990 | Schindler et al. | 357/22 |
| 5,086,331 | 2/1992 | Hartgring et al. | 257/379 |
| 5,202,751 | 4/1993 | Horiguchi | 257/532 |

FOREIGN PATENT DOCUMENTS

| | | |
|---|---|---|
| 4024728 | 2/1991 | Germany . |
| 57-114287 | 7/1982 | Japan . |
| 59-129909 | 7/1984 | Japan . |
| 2-56438 | 4/1990 | Japan . |

*Primary Examiner*—Mark V. Prenty
*Attorney, Agent, or Firm*—Young & Thompson

[57] ABSTRACT

A semiconductor device having a field-effect transistor has a MOS capacitor formed on a principal surface of a semiconductor substrate of the semiconductor device, and connecting a first and a second electrodes of the MOS capacitor to a source electrode and a drain electrode, respectively, of the field-effect transistor.

9 Claims, 4 Drawing Sheets

FIELD EFFECT TRANSISTOR HAVING CAPACITOR BETWEEN SOURCE AND DRAIN ELECTRODES

This application is a continuation of application Ser. No. 08/395,073, filed Feb. 27, 1995, now abandoned.

BACKGROUND OF THE INVENTION

1. Field of the Invention

The present invention relates to a semiconductor device having a junction type field-effect transistor (referred to as a junction type FET hereinafter).

2. Description of the Prior Art

A plan view of a prior-art semiconductor device having a conventional junction type FET is shown in FIG. 6(A), and an example of its circuit diagram is shown in FIG. 6(B).

Referring to FIG. 6(A), a source electrode (S) 2 and a drain electrode (D) 3 are formed on a surface of a semiconductor substrate (a semiconductor chip), where the electrodes 2 and 3 are composed respectively of bonding pads 21 and 23, and pluralities of finger parts 22 and 24 which extend respectively from the bonding pads 21 and 23 to the section above an N-type active region to be connected respectively to $N^+$-type diffused layers formed in that section. Further, $P^+$-type diffused layers are formed as a gate region (G) between the $N^+$-type diffused layers, and a gate electrode is led out from a $P^+$-type rear surface of the semiconductor substrate.

In the semiconductor device having the conventional junction type FET, a diode (Di) is formed between the gate electrode (G) and the source electrode (S) on the input side, and a Zener diode (Z-Di), for protecting the junction type FET against an overvoltage which is applied to the drain electrode, is formed between the drain electrode (D) and the source electrode (S) on the output side, as shown in FIG. 6(B) though omitted from FIG. 6(A). Such a technique is disclosed in, for example, Japanese Utility Model Application Laid-Open No. Hei 2-56438 (1990).

Since, however, the capacity (output capacity) between the source electrode and the drain electrode of the conventional junction type FET is a small parasitic capacity of the order of 2 to 3 pF, it is difficult to satisfactorily isolate high frequency noises from the outside. This capacity is computed by $C_{GD}$ (parasitic capacity between the gate electrode and the drain electrode)+$C_{DS}$ (parasitic capacity between the drain electrode and the source electrode). Since one has $C_{DS} \approx 0$, to obtain a large value for the capacity it is necessary to make $C_{GD}$ large by increasing the area of the gate region of the $P^+$-type diffused layer. However, an increase in the area of the gate region results in the deterioration in the characteristics, for example, a value of the conductance $g_m$ of the junction type FET is decreasing.

On the other hand, obtaining a sufficiently large capacity between the source electrode and the drain electrode by means of the Zener diode for the protective circuit requires a very large area, which is unrealistic.

Moreover, since these capacities are P-N junction capacities, a magnitude of the capacity depends on the difference between potentials applied to the source electrode and the drain electrode so that an isolation performance against the high frequency noises from external circuits varies with the output level of the junction type FET.

Additionally, it is not possible to effectively isolate the high frequency noises even if a capacitive element is installed outside the semiconductor substrate (semiconductor chip) because the capacitive element connected between the source electrode and drain electrode is not provided nearby the junction type FET.

As described in the above, in the conventional junction type FET it is not possible to isolate noises from external circuits so that there is a problem in that the characteristics (mutual conductance and the like) of the junction type FET is not stabilizing.

In particular, when the junction type FET is incorporated in an electret capacitor microphone (miniaturized microphone used in a portable telephone set such as a land mobile radio telephone set or in a portable radio equipment) as an amplifier, there arises a problem that it is liable to pick up noises of frequency higher than 10 kHz under an influence of a high frequency oscillator which generates a carrier wave nearby the junction type FET.

On the other hand, in the electret capacitor microphone or the like, it is necessary to discharge the electric charge, charged between electrodes, quickly so that the adoption of the junction type FET having an input gate of diode construction is required and it is not possible to adopt a MOSFET having a large input capacity, namely, having an input gate of capacitor construction, because of the deterioration of a speed corresponding to an input signal.

SUMMARY OF THE INVENTION

It is therefore an object of this invention to provide a semiconductor device which can effectively isolate noises impressed on the output side of the junction type FET.

It is another object of this invention to provide a semiconductor device which can effectively isolate input of the high frequency noises to the junction type FET without giving rise to an inconvenience to the intrinsic characteristics of the junction type FET.

It is still another object of this invention to provide a semiconductor device having the junction type FET suitable for use in an electret capacitor microphone.

It is a feature of this invention, in a semiconductor device having the junction type FET provided with a source electrode and a drain electrode on a principal surface of a semiconductor substrate, to form a MOS capacitor on the principal surface, and connect an upper electrode of the MOS capacitor to the source electrode and connect its lower electrode to the drain electrode. Here, the lower electrode may be constituted of a polysilicon film highly doped with an impurity such as boron or phosphorus, whereas the upper electrode may be constituted of a metallic film of aluminum or the like. In that case, it is preferable that the polysilicon film which is connected to the source or the drain electrode constituted the lower electrode by extending it on an insulating film formed on the principal surface to the region of formation of the MOS capacitor, and the drain or the source electrode and the upper electrode are formed integrally. Further, it is preferable that a capacitor dielectric film between the upper and the lower electrodes is constituted of a silicon oxide film, silicon nitride film, alumina film, phosphate glass film, borosilicate glass film, or a composite film formed by combining some of these films.

It is another feature of this invention, in a semiconductor device having an N-channel junction type FET which is provided with a source electrode and a drain electrode on a principal surface of a semiconductor substrate and has a P-type impurity region as a gate electrode, to form a MOS capacitor on the principal surface, connect an upper electrode of the MOS capacitor to the source electrode and connect its lower electrode to the drain electrode, and form on the semiconductor substrate a diode whose cathode is connected to the gate region and whose anode is connected to the source electrode. Here, a resistive element is formed on the semiconductor substrate, where one of the end parts of the resistive element may be connected to the source electrode and the other end part may be connected to the gate region.

It is another feature of this invention to form a source electrode and a drain electrode of a junction type FET on a principal surface of a semiconductor substrate, connect a MOS capacitor formed on the principal surface between the source electrode and the drain electrode, and use the device by incorporating it in an electret capacitor microphone.

BRIEF DESCRIPTION OF THE DRAWINGS

The above-mentioned and other objects, features and advantages of this invention will become more apparent by reference to the following detailed description of the invention taken in conjunction with the accompanying drawings, wherein:

FIG. 2 shows sectional views of the first embodiment of the semiconductor device according to the invention, where

FIG. 5 shows a second embodiment of the semiconductor device (semiconductor chip) of the invention, where FIG. 6 is a diagram showing a prior art semiconductor device, where

DESCRIPTION OF THE PREFERRED EMBODIMENTS

Figure 1:
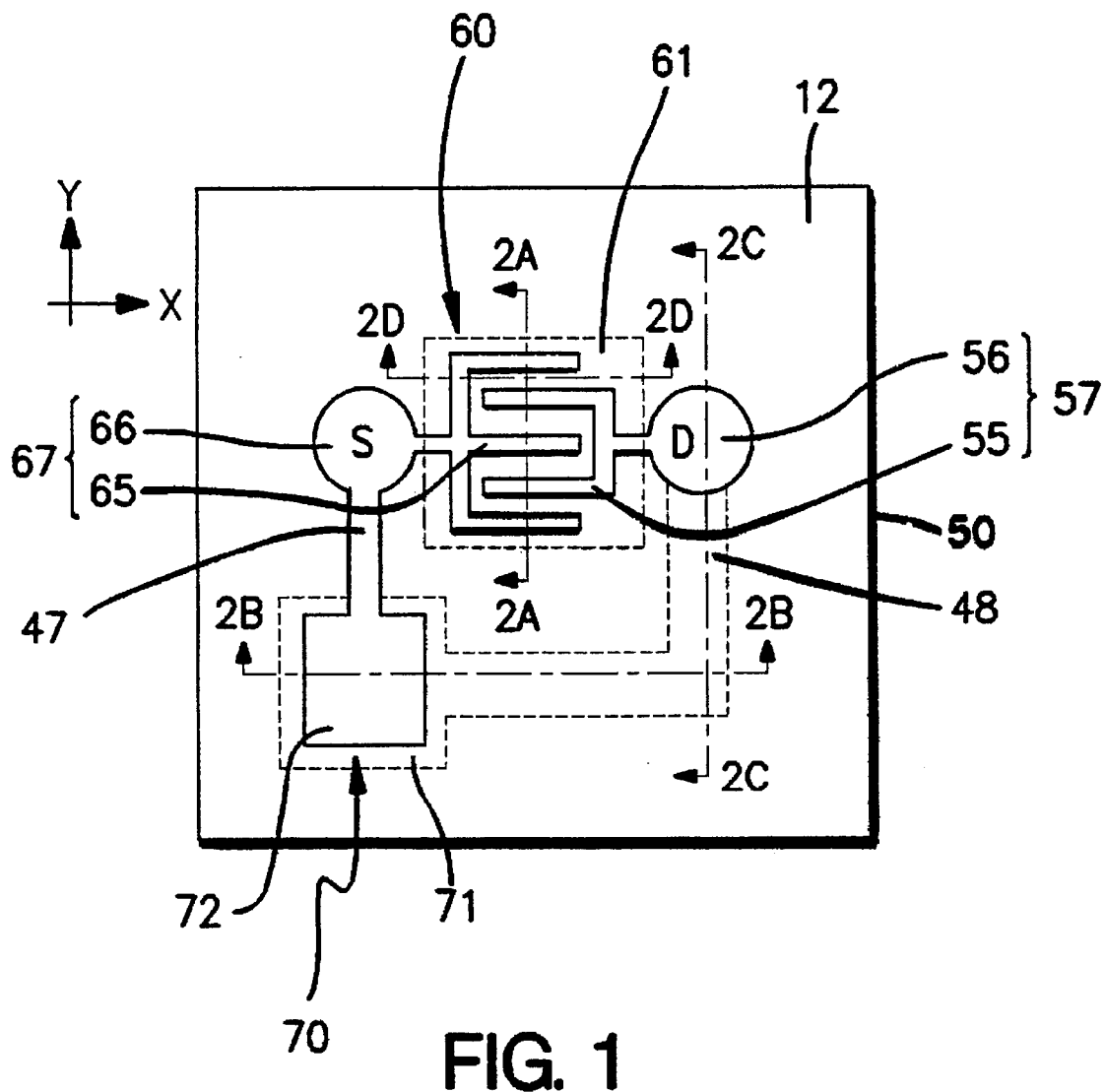
FIG. 1 is a plan view showing the semiconductor device (semiconductor chip) Of a first embodiment according to the invention.

Referring to the drawings, this invention will be described in the following.

FIG. 1 shows a semiconductor chip 50 having the first embodiment of the junction type FET has a junction type FET 60 and a MOS capacitor 70.

A 4 μm-thick N-type silicon epitaxial layer 61 is formed on a P$^+$silicon substrate 11, and a P$^+$-type element isolation region 12 is formed extending from a principal face (surface) 13 reaching the P$^+$-type silicon substrate 11, constituting a semiconductor substrate.

Figure 2A:
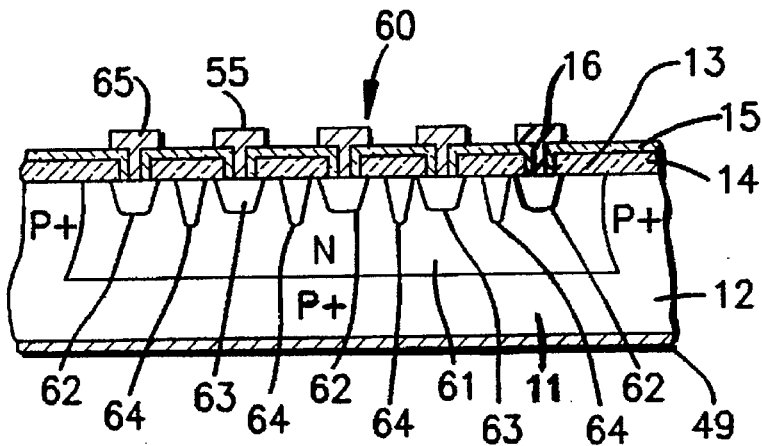
FIGS. 2(A), 2(B), 2(C) and 2(D) show the A–A' part, B–B' part; C–C' part and D–D' parts, respectively, of FIG. 1.

FIG. 2(A) shows 2 μm-deep slender N$^+$-type source regions 62 and N$^+$-type drain regions 63 extending in the X direction in FIG. 1. FIG. 2(A) shows slender 1.5 μm-wide and 3 μm-deep P$^+$-type gate regions 64 that extend in the same manner are formed between the two kinds of regions within the islandlike N-type silicon epitaxial layer 61. The N$^+$-type source-region 62, the N$^+$-type drain region 63 and P$^+$-type gate region 64 are alternately arrayed, in the Y direction in FIG. 1. The P$^+$-type gate regions 64 are connected to the P$^+$-type element isolation region 12, and are connected to a gate electrode 49 formed on the rear face of the P$^+$-type silicon substrate.

A 1 μm-thick silicon oxide film 14 is formed on the principal face 13, contact holes 16 reaching the respective source and the drain regions 63 and 63 are formed, and a 500 nm-thick silicon nitride film 15 is formed covering the top face of the silicon oxide film 14 and the side surfaces of the contact holes 16.

An aluminum based metallic source electrode 67 (S) is formed on the silicon nitride film 15, where the source electrode 67 has a circular bonding pad 66 and rectangular finger parts 65. The rectangular finger parts 65 are connected ohmically to the respective N$^+$-type source regions 62 through the contact holes 16. Similarly, an aluminum based metallic drain electrode 57 (D) is formed on the silicon nitride film 15, where the drain electrode 57 has a circular bonding pad 56 and rectangular finger parts 55. The rectangular finger parts 55 are connected ohmically to the respective N$^+$-type drain regions 63 through the contact holes 16.

Figure 2B:
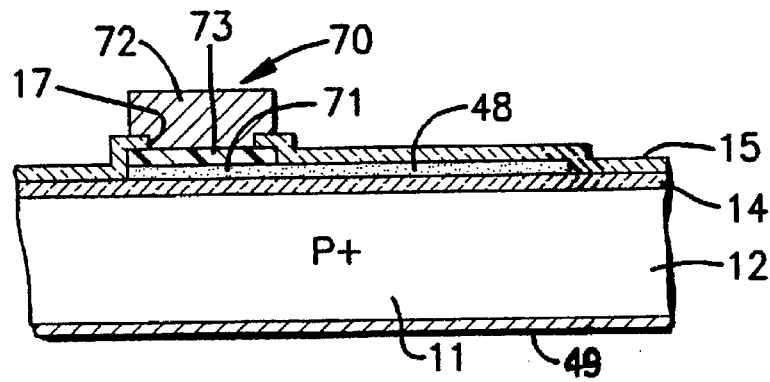

FIG. 2(B) shows a MOS capacitor 70 formed on the silicon oxide film 14 on the out side of the islandlike N-type silicon epitaxial layer 61. The MOS capacitor 70 is constituted of a lower electrode 71 made of 1 μm-thick polysilicon film which contains an impurity such as phosphorus or boron at a high concentration of more than $1 \times 10^{18}$ cm$^{-3}$ to reduce the electrical resistance formed on the silicon oxide film 14, a dielectric film 73 of silicon oxide formed on one part of the lower electrode 71, and an upper electrode 72 made of an aluminum based metal which is formed on the dielectric film 73 via an opening 17 in the silicon nitride film 15.

Figure 2C:
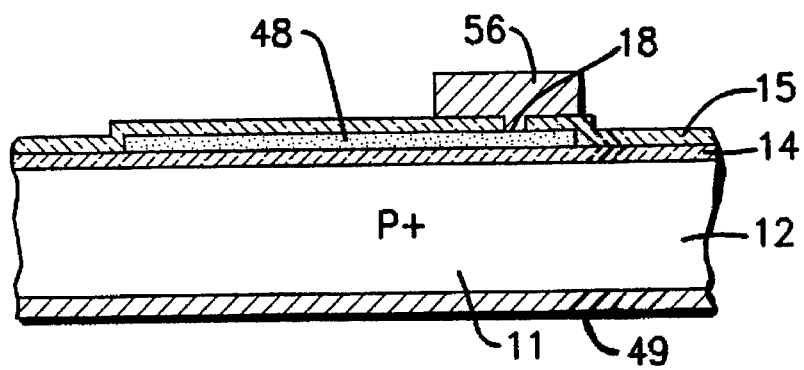
Figure 2D:
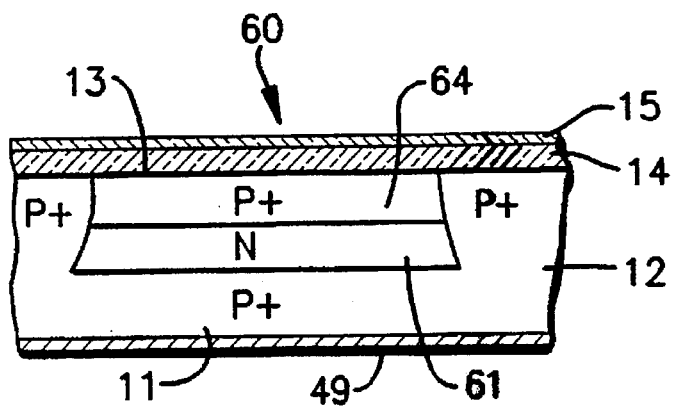

FIG. 2(C) shows the lower electrode 71 connected to the bonding pad 56 of the drain electrode 57 via a connecting part 48 formed extending on the silicon oxide film 14 and a contact hole 18 formed in the silicon nitride film 15.

On the other hand, the upper electrode 72 is connected to the bonding pad 66 of the source electrode 67 via an aluminum based connecting part 47 extending on the silicon nitride film 15. The bonding pad 66 of the source electrode 67 and the finger parts 65, and the connecting part 47 and the upper electrode 72 of the MOS capacitor 70 are formed integrally using an aluminum based metal.

When the thickness of the dielectric film 73 of silicon oxide is 50 nm, and the area of the capacitor, namely, the shape of the opening 17 where the upper electrode 72 makes contact with the dielectric film 73, is a square of a side of 170 μm, the capacitance value of the MOS capacitor 70 turns out to be 20 pF.

By inserting such a MOS capacitor 70 between the source electrode 67 and the drain electrode 57 the cut-off frequency f for the case where the input impedance of the circuit driven by the junction type FET is, for example, 1 MΩ, becomes f'=1/(2π×CR)=1/{2π×20 (pF)×1(MΩ)}=8×10$^3$ [Hz]=8 [KHz].

The MOS capacitor 70 connected between the source electrode 67 and the drain electrode 57 of the junction type FET has the function of a low pass filter which obstructs the passage of the frequency component (high frequency) higher than the cut-off frequency f'.

Although the case of 20 pF for the capacitance value of the MOS capacitor 70 and the load resistance value of 1 MΩ is described in the above, the capacitance value can freely be determined depending on the resistance value and the frequency desired to be cut off.

Figure 4:
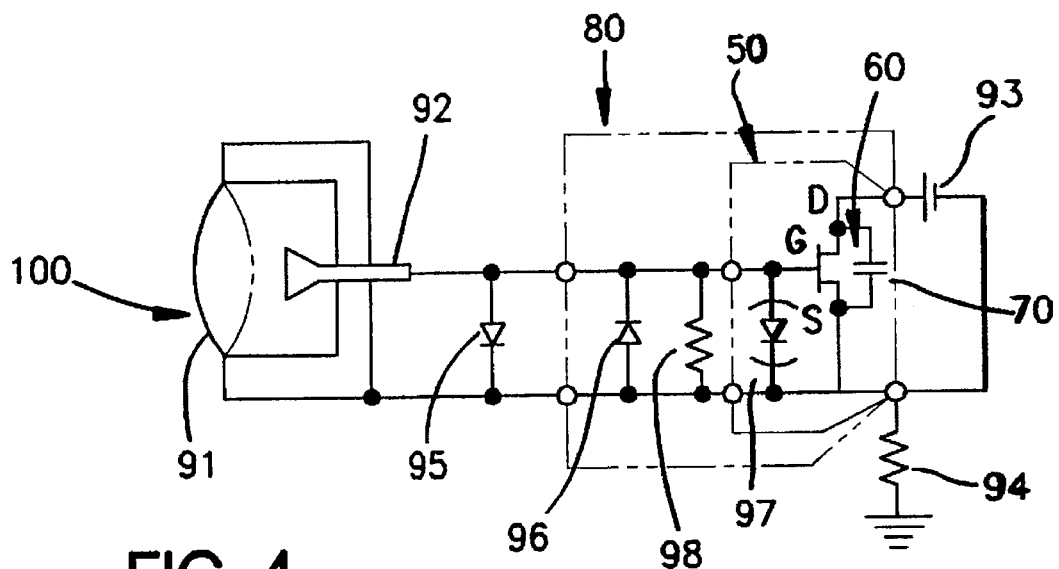
FIG. 4 is a schematic diagram showing the case of incorporating the embodiment of the semiconductor device according to the invention.
Figure 6A:
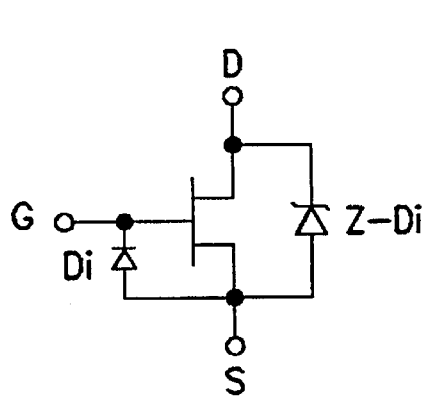
FIGS. 6(A) and 6(B) are a plan view and an equivalent circuit diagram.
Figure 6B:
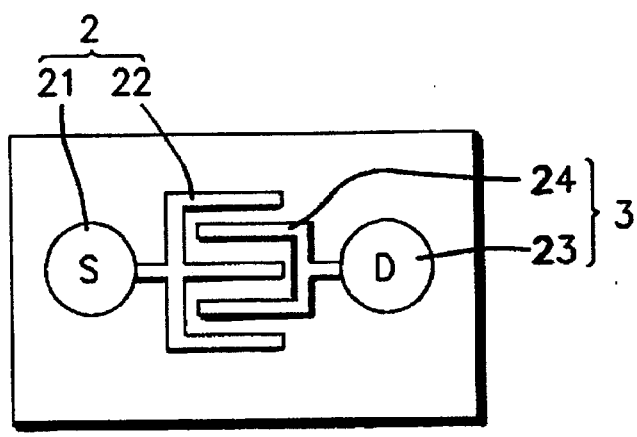

FIG. 4 is a schematic diagram showing a part of an electret capacitor microphone which uses the semiconductor device having the junction type FET of this invention.

The microphone uses a diaphragm (electret diaphragm) 91 made of a polymer film subjected to a special treatment so as to be imparted with the electret phenomenon in order to obviate the need for an external dc power supply. The back electrode 92 which faces the diaphragm 91 is connected to the gate-electrode G of the junction type FET 60 of this invention in which a MOS capacitor 70 is connected between the source and the drain, and supplies an input electrical signal to the FET 60 based on a sound 100.

The positive side of a battery 93 is connected to the drain electrode D of the FET, and its negative side is connected to the source electrode S of the FET. Further, the source electrode S is grounded via an output resistance $R_{OUT}$ 94.

A diode ($D_1$) 95 which converts a capacity component to an input voltage component is installed, and a diode ($D_2$) 96, a resistive element (R) 98 and a diode ($D_3$) 97 for quickly discharging the electric charges charged between the diaphragm system and the junction type FET are formed between the source electrode and the gate electrode of the junction type FET 60. Of these components the diode ($D_3$) 97 is the parasitic capacity between the source electrode and the gate electrode of the junction type FET 60. The resistive element (R) 98 is provided in order to discharge the charged electric charge corresponding to a voltage of 0 to 0.5 V, since a diode is not actuated until a voltage of the order of 0.6 V is applied across its both ends.

Figure 3:
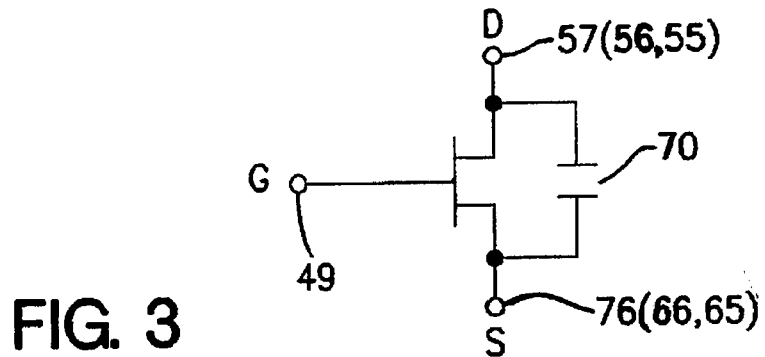
FIG. 3 is an equivalent circuit diagram showing the first embodiment of the semiconductor device according to the invention.

In FIG. 4, the region surrounded by the chain line 50 corresponds to the semiconductor device of the first embodiment shown in FIG. 1 through FIG. 3. The Junction type FET 60, the MOS capacitor 70 and the parasitic diode (diode formed by the P-N junction within the junction type FET) 97 are formed in the semiconductor device 50, and other elements are externally connected to various terminals (marked by small open circles on the chain line 50 in FIG. 4) of the semiconductor device.

On the other hand, the region indicated by the chain line 80 in FIG. 4 shows the semiconductor device 80 of a second embodiment in which the diode ($D_2$) 96 and the resistive element (R) 98 are also integrated on the semiconductor chip.

In FIG. 5, the parts with functions identical or similar to those of FIG. 1 through FIG. 3 are marked with identical symbols to omit overlapped description.

Figure 5A:
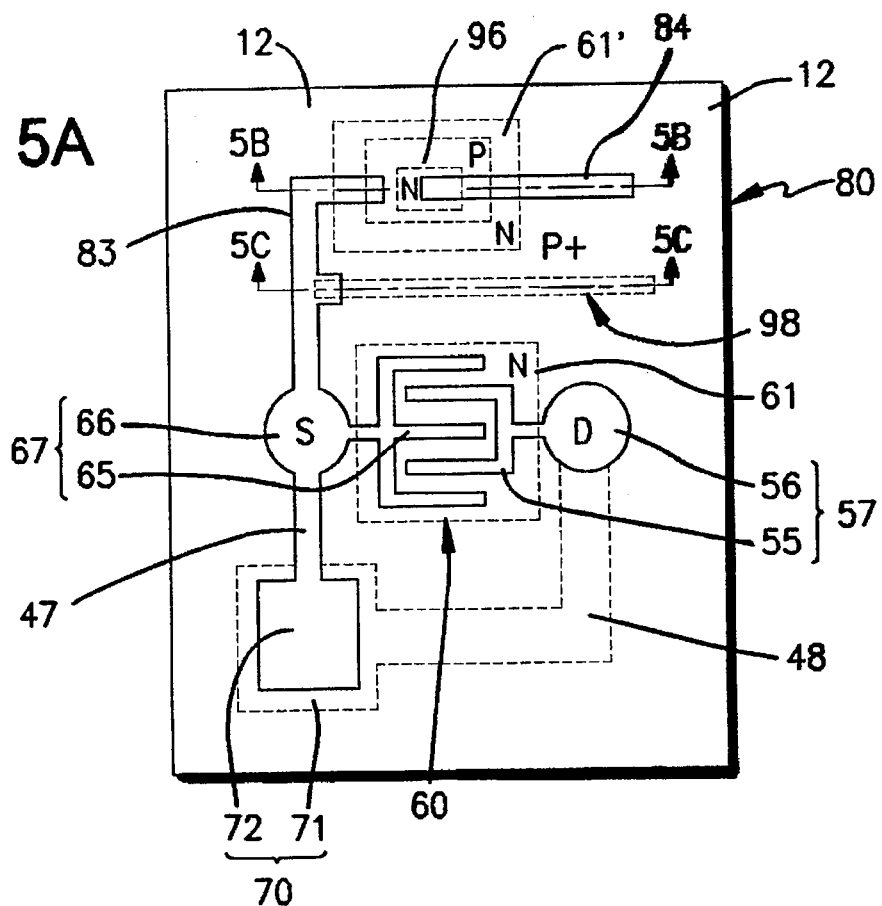
FIG. 5(A) is a plan view.
Figure 5B:
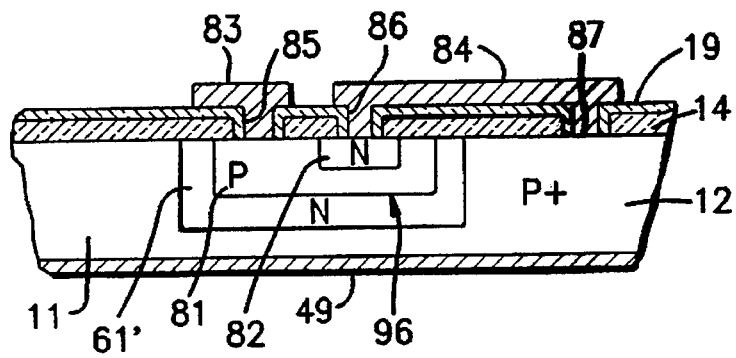
FIGS. 5(B) and 5(C) are sectional views of B–B' part and C–C' part, respectively of FIG. 5(A)

In FIG. 5(A) and FIG. 5(B), a P-type impurity region 81 is formed within an island like N-type silicon epitaxial layer 61' surrounded by the $P^+$-type element isolation region 12, and an N-type impurity region 82 is formed within the region 81. The diode ($D_2$) 96 is constituted of the P-N junction between both regions 81 and 82. An aluminum based connecting part 83 extends on a silicon nitride film 19 from the bonding pad 66 of the source electrode 67, and is connected to the P-type impurity region 81 via a contact hole 85. An aluminum based connecting part 84 connected to the N-type impurity region 82 via a contact hole 86, is coupled with the gate region and the gate electrode by being connected to the $P^+$-type element isolation region 12 via a contact hole 87. The diode ($D_2$) 96 is connected in this manner between the source and the gate of the junction type FET 60.

Figure 5C:
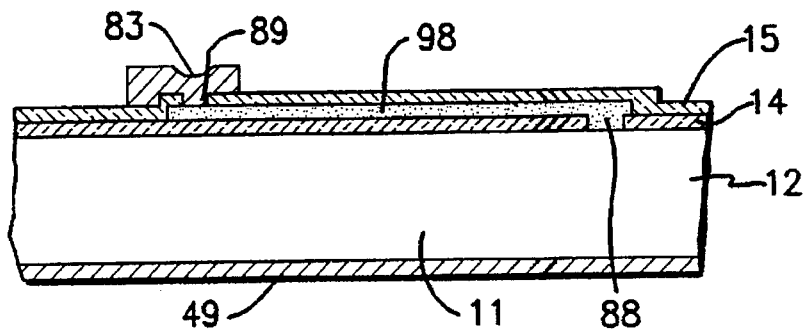

In FIG. 5(C), the resistive element (R) 96 with breadth of 20 μm, length of 200 μm and thickness of 0.8 μm, made of polycrystalline silicon with resistivity $1 \times 10^9 \Omega \cdot cm$, is formed on the silicon oxide film 14. One of the end parts of the resistive element (R) 98 is connected via a contact hole 89 to the connecting part 83 from the source electrode, and the other end part of the resistive element 98 is connected via a contact hole 88 to the $P^+$-type element isolation region 12 to be coupled with the gate region and the gate electrode. The resistive element (R) 98 is connected in this manner between the source and the gate of the junction type FET 60.

In the above examples, a silicon oxide film with relative dielectric constant of 3.7 to 3.9 is used as the dielectric film 73. However, a silicon nitride film with relative dielectric constant 6.0 to 7.4, an alumina film, a phosphosilicate glass film or a borophosphosilicate glass film, or a composite dielectric film formed by combining these films can also be used as the dielectric film 73.

As has been described in the above, this invention has a MOS capacitor connected between the source and the drain of a junction type FET, so that it is possible to isolate noises from external circuits driven by the junction type FET. As a result, it is possible to suppress especially the fluctuations in the mutual conductance characteristic of the junction type FET.

Moreover, even when the junction type FET is incorporated in an electric capacitor microphone in which a high frequency oscillator is installed nearby, it is possible to effectively isolate the high frequency noises from the high frequency oscillator.

Although the invention has been described with reference to specific embodiments, this description is not meant to be construed in a limiting sense. Various modifications of the disclosed embodiments, as well as other embodiments of the invention, will become apparent to persons skilled in the art upon reference to the description of the invention. It is therefore contemplated that the appended claims will cover any modifications or embodiments as fall within the true scope of the invention.

What is claimed is:

1. A semiconductor device comprising:
    a field-effect transistor having a source electrode and a drain electrode formed in a semiconductor substrate, and a gate electrode for receiving an audio frequency input signal;
    a diode element connected between said gate electrode and said source electrode for discharging an electric charge between said gate electrode and said source electrode; and
    a capacitor element comprising a lower electrode formed on said semiconductor substrate, an upper electrode formed above said lower electrode, and a dielectric film interposed between said lower electrode and said upper electrode, said capacitor element being electrically connected between said source electrode and said drain electrode formed in said semiconductor substrate.

2. A semiconductor device comprising a first layer of a first conductivity type, a second layer of a second conductivity type selectively formed in said first layer, a gate region of said first conductive type selectively formed to said second layer, said second layer thereby having a drain region, a source region and a channel region, a first insulating film covering said first and second layers and said gate region, a drain electrode formed on said first insulating film and having a portion connected to said drain region through a first opening formed in said first insulating film, a source electrode formed on said first insulating film and having a portion connected to said source region through a second opening formed in said first insulating film, a lower electrode formed on said first insulating film and connected to one of said source and drain electrodes, a dielectric film formed on said lower electrode, and an upper electrode formed on said dielectric film and connecting to the other of said source and drain electrodes.

3. The semiconductor device as claimed in claim 2, further comprising a resistive film formed on said first insulating film and connected to said source electrode.

4. The device as claimed in claim 3, further comprises a PN diode formed in said first layer in isolation therefrom, said PN diode being connected between said source electrode and the gate region.

5. A semiconductor device comprising:
   a field-effect transistor having a gate electrode for receiving an audio frequency input signal, a source electrode and a drain electrode formed in a semiconductor substrate;
   a capacitor connected between said source electrode and said drain electrode formed in said semiconductor substrate; and
   a diode element connected between said gate electrode and said source electrode for discharging an electrical charge between said gate electrode and said source electrode.

6. A semiconductor device comprising:
   a field effect transistor having a source electrode and a drain electrode formed in a semiconductor substrate, a gate electrode for receiving an input signal, and a resistor connected between said gate electrode and said source electrode;
   a diode element connected between said gate electrode and said source electrode;
   a diode element connected between said gate electrode and said source electrode for discharging an electric charge between said gate electrode and said source electrode;
   a capacitor element comprising a lower electrode formed on said semiconductor substrate, an upper electrode formed above said lower electrode, and a dielectric film interposed between said lower electrode and said upper electrode, said capacitor element being electrically connected between said source electrode and said drain electrode formed in said semiconductor substrate.

7. A semiconductor device comprising:
   a field effect transistor having a gate electrode for receiving an input signal, a source electrode and a drain electrode formed in a semiconductor substrate, and a resistor connected between said gate electrode and said source electrode;
   a capacitor connected between said source electrode and said drain electrode formed in said semiconductor substrate;
   a diode element connected between said gate electrode and said source electrode for discharging an electrical charge between said gate electrode and said source electrode.

8. The semiconductor device as claimed in claim 1, wherein said capacitor isolates high frequency noises in excess of 10 kHz.

9. The semiconductor as claimed in claim 5, wherein said capacitor isolates high frequency noises in excess of 10 kHz.

* * * * *